United States Patent [19]

Schneider et al.

[11] Patent Number: 5,711,300
[45] Date of Patent: Jan. 27, 1998

[54] REAL TIME IN VIVO MEASUREMENT OF TEMPERATURE CHANGES WITH NMR IMAGING

[75] Inventors: Erika Schneider, Rexford; Harvey Ellis Cline; Ronald Dean Watkins, both of Schenectady, all of N.Y.; Sheila Srinivasan Washburn, New Berlin, Wis.; Christopher Judson Hardy, Schenectady, N.Y.

[73] Assignee: General Electric Company, Wausksha, Wis.

[21] Appl. No.: 515,876

[22] Filed: Aug. 16, 1995

[51] Int. Cl.$^6$ ............................................. A61B 8/00
[52] U.S. Cl. ............................... 128/653.2; 128/653.4; 128/653.5
[58] Field of Search ........................... 128/653.2, 653.4, 128/653.5

[56] References Cited

U.S. PATENT DOCUMENTS 5,378,987  1/1995  Ishihara et al. .................... 128/653.2

OTHER PUBLICATIONS

*On–Line Monitoring of Ultrasonic Surgery with MR Imaging*, JMRI vol. 3 No. 3 May/Jun. 1993, pp. 509–514.
*Further Observations on the Measurement of Tissue $T_1$ to Monitor Temperature in Vivo my MRI*, MRM 31:342–345 (1994), I.R. Young, et al.
*Optimization of Gradient–Echo Pulse–Sequences for Dynamic Imaging of Hyperthermia*, A.L. Alexander, et al.
*Measurement of Brain Temperature In Vivo Using $^1$NMR Spectroscopy*, p. 516, R. Corbett, et al.
*Tissue Temperature Monitoring for Thermal Intervention Therapy: Comparison of T1–weighted MR Sequences*, JMRI vol. 4 No. 1 Jan./Fed 1994, pp. 65–70, R. Matsumoto, et al.
*Temperature Mapping Using Water Proton Chemical Shift*, p. 1569, K. Kuroda, et al.
*"Real–time" Temperature Imaging of Interstitial Laser Thermotherapy Using the Water Proton Chemical Shift*, p. 1584, R. Stollberger, et al.
*Thermal Mapping using the MR Image Phase In Vivo During Hyperthermia*, p. 1578, J.R. MacFall, et al.
*Non–Invasive In–Vivo Thermometry with the Proton Resonance Frequency Method: Qualitative Results in Human Muscle*, p. 738, J. De Poorter, et al.
*The Proton Resonance Frequency Method for Noninvasive MRI Thermometry: Study of Susceptibility Effects*, p. 426, J. De Poorter.

Primary Examiner—Marvin M. Lateef
Assistant Examiner—Derrick Fields
Attorney, Agent, or Firm—Quarles & Brady

[57] ABSTRACT

NMR images indicative of thermal changes in tissues undergoing therapy are produced using a gradient-recalled double-echo pulse sequence. A reference phase image is produced using a short echo time ($TE_1$) and a measurement phase image is produced with a longer echo time ($TE_2$). Temperature maps are produced during therapy using the phase difference information at corresponding pixels of the two phase images.

12 Claims, 2 Drawing Sheets

5,711,300

1

REAL TIME IN VIVO MEASUREMENT OF TEMPERATURE CHANGES WITH NMR IMAGING

BACKGROUND OF THE INVENTION

The field of the invention is nuclear magnetic resonance imaging methods and systems. More particularly, the invention relates to the in vivo measurement of temperature changes using NMR imaging techniques.

When a substance such as human tissue is subjected to a uniform magnetic field (polarizing field Be), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Thermal changes in substances undergoing MR imaging or NMR spectroscopy are known to cause spin resonance frequency shifts owing to changes in the magnetic susceptibility. Several MR imaging techniques have been proposed to monitor temperature changes in tissues in vivo. These methods can have inherently low spatial resolution or they are slow temporally. Also, tissues undergoing thermal therapy may change in character, and these changes may affect the NMR measurement separately from the temperature change in the tissue. As a result, in vivo NMR temperature measurements are much less accurate than measurements made on phantoms.

SUMMARY OF THE INVENTION

The present invention is a method for producing a temperature map which indicates the change in temperature from a reference condition for in vivo tissues. A reference phase image is produced using an NMR pulse sequence with a short echo time ($TE_1$); a measurement phase image is then produced using an NMR pulse sequence with a long echo time ($TE_2$); and a temperature map is produced by calculating the phase difference or complex difference at each pixel of the two phase images.

A general object of the invention is to improve the accuracy of in vivo tissue temperature measurements. By selecting the two echo times ($TE_1$ and $TE_2$) such that one coincides with the signals from fat spins and water spins being in-phase, and the other echo time coincides with these signals being out-of-phase, the resulting measurement is self-referencing. Inaccuracies due to differences in tissue types and changes in tissues during therapy are eliminated.

Another object of the invention is to produce temperature maps in real time during a therapy procedure. The phase images are high spatial resolution 2DFT NMR images that may be continuously acquired during therapy. A single, dual-echo pulse sequence may be used to acquire both the reference and measurement phase image data. In the alternative, an initial phase image may be used as the reference phase image, and updated temperature maps can be produced after the acquisition of measurement phase images using a single-echo pulse sequence.

DESCRIPTION OF THE PREFERRED EMBODIMENT

Figure 1:
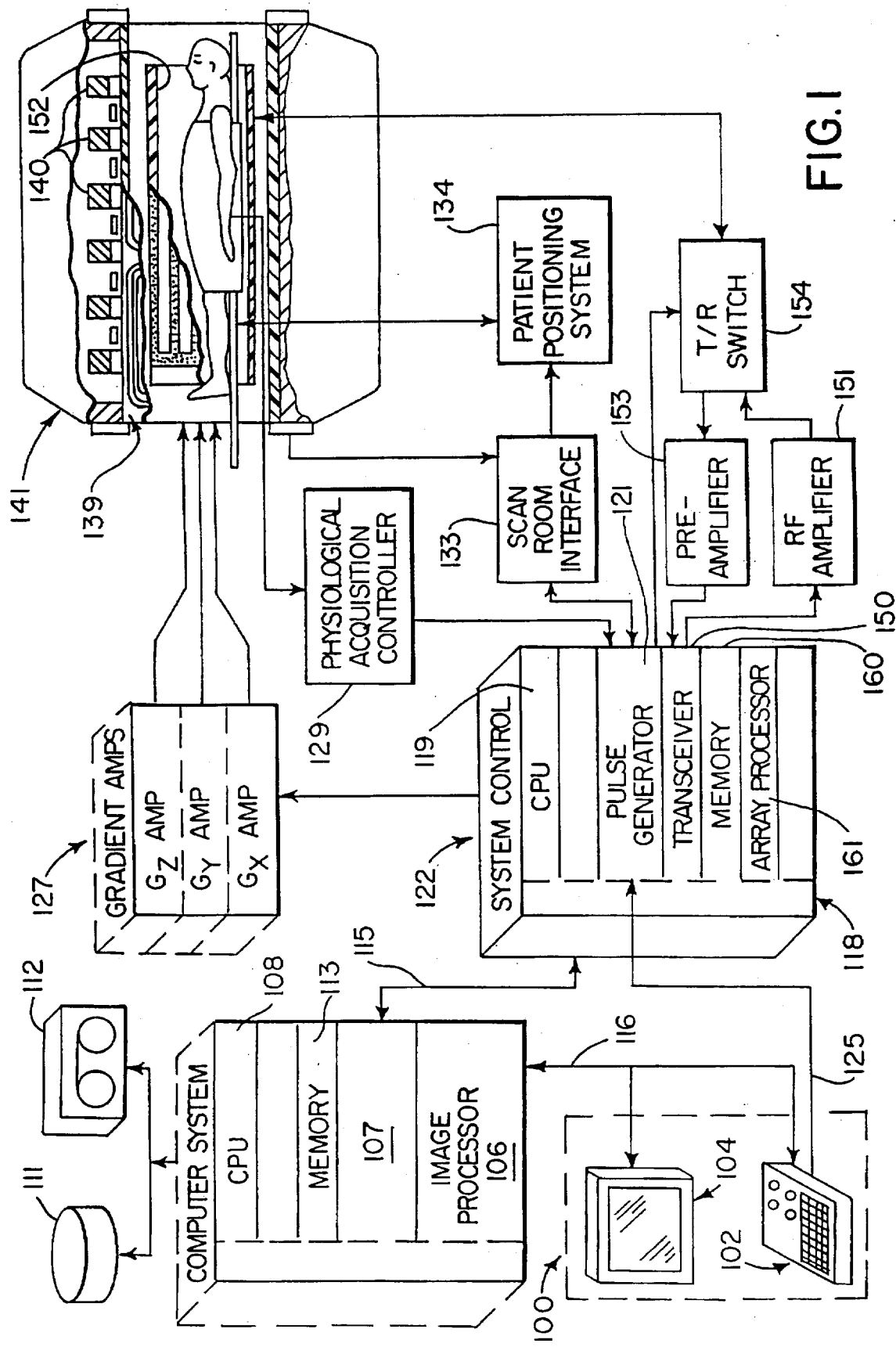
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 112 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
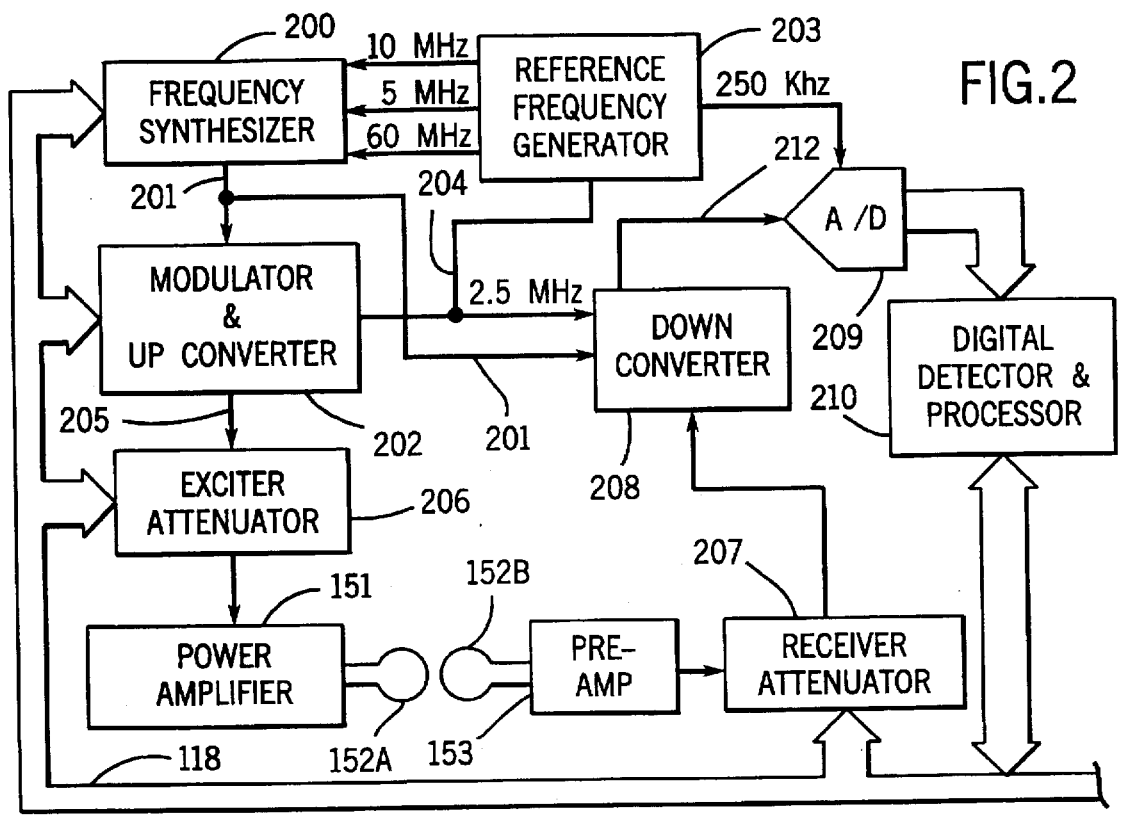
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. These provide a reference phase for the received NMR signals such that the phase is accurately reflected in the I and Q values. For a more detailed description of the receiver, reference is made to U.S. Pat. No. 4,992,736 which is incorporated herein by reference.

To practice the present invention a scan is performed using an imaging pulse sequence, and an image is reconstructed in which the phase information at each image pixel is preserved. A two-dimensional image pulse sequence is employed in the preferred embodiment, and a two-dimensional Fourier transformation is performed on the acquired array of complex signal samples. The phase at each image pixel may be calculated as the argument of the complex value at the pixel: $\phi = \tan^{-1} Q/I$. As will be described below, this phase measurement may be used to calculate a phase difference ($\Delta\phi$) at each image pixel which indicates tissue temperatures. In the alternative, the complex difference may be used to produce a temperature map, in which case, the I and Q values at each pixel are used. In the preferred embodiment a gradient recalled echo pulse sequence is employed to acquire this phase image data.

Figure 3:
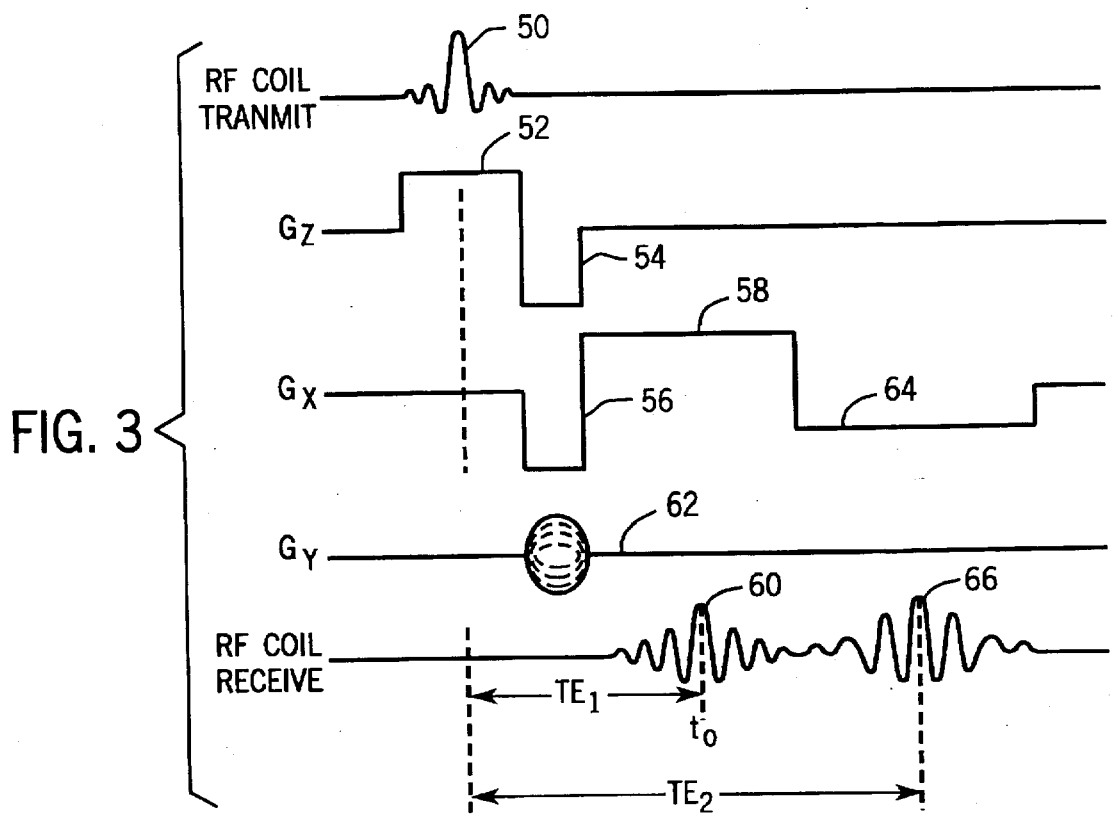
FIG. 3 is a graphic representation of a preferred pulse sequence used to acquire the phase image data according to the present invention.

Referring to FIG. 3, a gradient echo pulse sequence begins with the transmission of a narrow bandwidth radio frequency (RF) pulse 50 in the presence of slice selection $G_z$ pulse 52. The energy and the phase of this initial RF pulse may be controlled such that at its termination the magnetic moments of the individual nuclei are aligned in the x-y plane of a rotating reference frame of the nuclear spin system. A pulse of such energy and duration is termed a 90° RF pulse.

The result of the combined RF signal and gradient pulse 52 is that the nuclear spins of a narrow slice in the three dimensional imaged object along spatial z-plane are excited. Only those spins with a Larmor frequency, under the combined field $G_z$ and $B_0$, within the frequency bandwidth of the RF pulse will be excited. Hence the position of the slice may be controlled by the gradient $G_z$ intensity and the RF frequency.

A negative $G_z$ rewinder gradient pulse 54, serves to rephase the nuclear spins in the x-y plane of the rotating frame. Rewinder pulse 54 therefore is approximately equal to half the area of that portion of slice select gradient 52 which occurs during the RF pulse 50.

After or during the application of the $G_z$ rewinder pulse 54, the $G_x$ prewinder pulse 56 is applied. The prewinder pulse 56 begins to dephase the precessing nuclei; those nuclei at high spatial locations within the slice advance in phase faster as a result of the $G_x$-induced higher Larmor frequency than those nuclei at lower spatial locations. Subsequently, a positive $G_x$ readout pulse 58, centered at time $TE_1$, after the center of RF pulse 50 causes the dephased spins to rephase into a first gradient echo or NMR signal 60 at or near the center of the read-out pulse 58. The gradient echo 60 is the NMR signal for one row or column in a reference phase image. The read-out gradient $G_x$ is then reversed to form a second read-out pulse 64, and a second gradient echo NMR signal 66 is formed and acquired. The second gradient echo 66 is centered at $TE_2$ and it produces the data for one row or column in a measurement image. As will become apparent below, the echo times $TE_1$ and $TE_2$ are selected very carefully to time the two echo signals 60 and 66 with the relative phase of fat and water spins. Variable bandwidth methods such as that described in U.S. Pat. No. 4,952,876 entitled "Variable Bandwidth Multi-echo NMR Imaging" may also be used to advantage to improve SNR and is hereby incorporated by reference.

In a two dimensional imaging sequence, a gradient pulse $G_y$ is applied to phase encode the spins along the y axis during the prewinder gradient 56. The sequence is then repeated with different $G_y$ gradients, as is understood in the art, to acquire an NMR view set from which a tomographic image of the image object may be reconstructed according to conventional 2DFT reconstruction techniques.

The NMR signals 60 and 66 are the sum of the component signals from many precessing nuclei throughout the excited slice. Ideally, the phase of each component signal will be determined by the strength of the $G_z$, $G_x$ and $G_y$ gradients at the location of the individual nuclei during the readout pulses 58 and 64, and hence by the spatial z-axis, x-axis and y-axis locations of the nuclei. In practice, however, numerous other factors affect the phase of the NMR signals 60 and 66—including the temperature of the scanned tissues.

Tissue magnetic susceptibility changes as a function of temperature. This susceptibility change in turn causes spin resonance frequency shifts which vary linearly with temperature. For water the spin resonance frequency changes at a rate of approximately 0.01 ppm/°C. and for fat at a rate of approximately 0 ppm/°C. The resulting frequency shifts at three polarizing field strengths are set forth in Table 1.

TABLE 1

|  | $B_0 = 0.5T$ | $B_{0-1.0T}$ | $B_0 = 1.5T$ |
|---|---|---|---|
| Water Rate = 0.01 ppm/°C. | $\Delta v = 0.21$ Hz/°C. | $\Delta v = 0.42$ Hz/°C. | $\Delta v = 0.63$ Hz/°C. |
| Fat Rate = 0.0 ppm/°C. | $\Delta v = 0$ | $\Delta v = 0$ | $\Delta v = 0$ |

Typical temperature changes in tissues due to various therapies and procedures are set forth in Table 2.

TABLE 2

| Therapy | Temperature Change | Frequency Shift at 1.5T |
|---|---|---|
| Localization | 0–5° C. | 0–3.2 Hz |
| Focused Ultrasound | 23–63° C. | 14.5–40 Hz |
| Classic Hyperthermia | 8–13° C. | 5–8.2 Hz |
| Hypothermia | −237° C. | −150 Hz |

Thermally induced chemical shift changes can be sensitively monitored using phase images because the MR signal phase (proportional to frequency) shifts linearly as a function of temperature. For water spins (0.01 ppm/°C.), a relative 4.5 degree/°C. phase shift occurs at 1.5 T for a 20 msec echo time (TE) in a gradient-recalled echo pulse sequence (0.63 Hz/°C.*20 msec*360°/cycle). On the other hand, a relative signal phase shift of ~0 degrees/°C. will be observed from fat spins. Since tissues are composed of different combinations of fat and water, and since the composition of the tissues may change as a function of temperature, the measurement of tissue temperature in vivo is complex. Precision is also reduced by patient motion during the scan, and spin relaxation time changes during therapy.

The accuracy of in vivo temperature measurement is improved according to the present invention by using the difference between images in which one phase image serves as a reference. Also, the echo times (TE) of the pulse sequences used to acquire the two phase images are chosen such that the signals from fat spins and water spins are either in phase, or out of phase with each other. Table 3 sets forth some of the echo times (TE) for the gradient-recalled echo pulse sequence of FIG. 3 to produce NMR signals with fat and water spins either in-phase or out-of-phase.

TABLE 3

| Resonance | $B_0 = 0.5T$ | $B_0 = 1.0T$ | $B_0 = 1.5T$ |
|---|---|---|---|
| Fat-Water Resonance Frequency Difference | $\Delta v = 73$ Hz | $\Delta v = 146$ Hz | $\Delta v = 220$ Hz |
| Fat-Water In-Phase, (TE) | 13.8 ms | 6.9 ms | 4.6 ms |
|  | 27.6 ms | 13.8 ms | 9.2 ms |
|  | 41.4 ms | 20.7 ms | 13.8 ms |
|  | 55.2 ms | 27.6 ms | 18.4 ms |
|  | 69.0 ms | 34.5 ms | 23.0 ms |
|  |  | 41.4 ms | 27.6 ms |
|  |  | 48.3 ms | 32.2 ms |
|  |  | 55.2 ms | 36.8 ms |
| Fat-Water Out-of-Phase, (TE) | 6.9 ms | 3.4 ms | 2.3 ms |
|  | 20.7 ms | 10.3 ms | 6.9 ms |
|  | 34.5 ms | 17.2 ms | 11.5 ms |
|  | 48.3 ms | 24.1 ms | 16.1 ms |
|  | 62.1 ms | 31.0 ms | 20.7 ms |

A temperature map is produced according to the present invention by performing two phase image acquisitions. The first phase image is acquired with a short echo time ($TE_1$) selected from the above Table 3 with fat and water spins either in-phase or out-of-phase. This acquisition serves as a spatial, composition, relaxation time, and temperature reference phase image.

A second phase image is acquired with an echo time ($TE_2$) selected from the above Table 3 with fat and water spins in the opposite condition to that of the reference acquisition. In other words, if the $TE_1$ for the reference phase image is chosen with fat and water spins in-phase, then the second phase image is acquired with fat and water spins out-of-phase, or visa versa. When the difference between the two phase images is used to produce a temperature map, the resulting temperature map is not affected by susceptibility and frequency changes due to the two types of spins present in the imaged tissues, and the accuracy of the measurement is substantially improved.

The information necessary to produce a temperature map is contained in the phase difference between the reference and measurement images. This information can be extracted in a number of ways. First, the phase difference ($\Delta \phi$) may be calculated at each image pixel $$\Delta \phi = \tan^{-1} Q_2/I_2 - \tan^{-1} Q_1/I_1.$$

These phase difference values ($\Delta \phi$) are multiplied by a constant to produce numbers indicative of relative temperature. This is the preferred method when a quantitative temperature map is produced.

On the other hand, when temperature sensitivity is more important, a complex difference (D) method is used to produce the temperature map. The complex difference (D) is calculated at each temperature image pixel using the corresponding $I_1$, $Q_1$, $I_2$ and $Q_2$ values of the respective measurement phase and reference phase images.

$$\theta = \tan^{-1} Q_2/I_2 - \tan^{-1} Q_1/I_1$$

$$|M_1| = \sqrt{I_1^2 + Q_1^2}$$

$$|M_2| = \sqrt{I_2^2 + Q_2^2}$$

$$D = \sqrt{|M_1|^2 + |M_2|^2 - 2|M_1||M_2|\cos\theta}$$

The sensitivity of the temperature measurement is selected by the magnitude of the difference in echo time ($TE_2 - TE_1$). The use of longer echo times increases the sensitivity of the temperature measurement, but it also increases the likelihood of phase wraparound. Such wraparound can be corrected using standard techniques such as that described by G. H. Glover, "Multipoint Dixon Sequences for Proton Water, Fat and Susceptibility Imaging," J. Magn. Reson. Imaging 1:521–530 (1991); and G. H. Glover, E. Schneider, "Three-Point Dixon Technique for True Water/Fat Decomposition with Bo Inhomogeneity Correction," Magn. Reson. Med 18:371–383 (1991).

While a double echo pulse sequence is used in the preferred embodiment to acquire both phase images in a single scan, a single echo pulse sequence can also be used. In such case it is not necessary to repeat the reference image acquisition each time a temperature map is to be produced during a therapy procedure. If the first reference image is retained, subsequent phase images need only be acquired at the second echo time for self-referencing to be effective. However, if during the course of therapy significant tissue changes occur, it may be desirable to re-scan and update the reference phase image.

Additional acquisition time may be saved if "keyhole" or other partial k-space imaging methods are used in conjunction with the present self-referenced temperatures mapping method.

The invented method is a highly accurate method for measuring in vivo thermal changes provided $T_2^*$ decay has not occurred. At the longer echo times ($TE_2$) used to obtain high thermal phase sensitivity, correction of $T_2^*$ decay will be necessary. This correction can be accomplished in a straightforward manner as described in the Appendix. In the same manner, local magnetic field ($B_0$) or $T_2^*$ alterations due to thermal variations in the imaging environment can also be estimated and accounted for in the phase difference image. The $T_2^*$ decay can be determined by monitoring the decrease in the magnitude signal value between the reference phase image and the second phase image. The magnitude signal decrease can be used to estimate $T_2^*$ and compute the net phase difference resulting from magnetization decay. An example is given in the Appendix for a Lorentzian distribution.

A rapid, high spatial and high temperature resolution in vivo temperature mapping technique has been presented. The thermal measurement technique is self-referenced enabling the monitoring of temperature in heterogeneous tissues and during a therapy procedure. While a gradient-recalled echo pulse sequence is used to produce the phase images in the preferred embodiment, other well-known imaging pulse sequences can be used. Single and double spin echo pulse sequences can also be used, and either 2D or 3D pulse sequences will work.

Also, while $TE_1$ and $TE_2$ are different in the preferred embodiment, this is not necessary. TE1 and TE2 can be the same. In this instance, TE1 and TE2 do not need to fall on fat-water in and out-of-phase boundaries, but may take on any value.

APPENDIX

In gradient-recalled echo (GRE) imaging, both susceptibility and field heterogeneity contribute to $T_2^*$. This term gives rise to distribution of Larmor frequencies (resonance half-width), which can be described as a Lorentzian. The observed signal intensity decreases in direct proportion to the effective $T_2^*$ which is computed by $$\frac{1}{T_2^*} = \frac{1}{T_2'} + \frac{1}{T_2} \tag{1}$$

where $T_2$ is the intrinsic spin—spin relaxation time and $T_2'$ represents the contribution from magnetic susceptibility and magnetic field inhomogeneities. Both the $T_2$ and $T_2'$ terms can be thermally variant as both magnetic susceptibility, tissue content and character, as well as inherent spin—spin relaxation times depend on temperature. Loss of coherence can be estimated by $$\frac{S(TE_2)}{S(TE_1)} = \exp\left[\frac{-(TE_2 - TE_1)}{T_2^*}\right] \tag{2}$$

or it can be estimated from exact signal intensity computations. For an rf-spoiled GRE exam or an unspoiled GRE exam with $TR \gg T_2^*$, signal is computed $$S(TE, TR, T_2^*, T_1) = \tag{3}$$

$$\frac{\rho\, k \sin\alpha}{\left(1 - \cos\alpha \exp\left[\frac{-TR}{T_1}\right]\right)} \left(1 - \exp\left[-\frac{TR}{T_1}\right]\right) \exp\left[-\frac{TE}{T_2^*}\right]$$

arbitrary parameter GRE images, $$S(TE, TR, T_2^*, T_1) = \tag{4a}$$

$$\frac{\rho\, k \sin\alpha}{(1 - \cos\alpha)} \left(\frac{1 - \cos\alpha - a}{\sqrt{a^2 - b^2}} + 1\right) \exp\left[-\frac{TE}{T_2^*}\right]$$

with $$a = \frac{1 - \exp\left[\frac{-TR}{T_1}\right] \exp\left[\frac{-2TR}{T_2}\right] + \cos\alpha \left(\exp\left[\frac{-2TR}{T_2}\right] - \exp\left[\frac{-TR}{T_1}\right]\right)}{1 - \exp\left[\frac{-TR}{T_1}\right]} \tag{4b}$$

and $$b = (1 - \cos\alpha)\exp\left[\frac{-TR}{T_2}\right] \tag{4c}$$

Echo signal intensity and, thus phase, will vary as a function of the pulse sequence parameters selected. When using phase difference self-referencing techniques it will be possible to estimate the phase contribution to $T_2^*$ from equation 2 for either GRE or SPGR acquisition sequences. The phase accumulated ($\Delta\phi$) due to the $T_2^*$ decay in the second image relative to the first image may be estimated and subtracted from the phase difference map in a pixel-by-pixel manner $$\Delta\phi(\text{rad}) = \Delta\nu\Delta\tau = \frac{2\pi}{T_2^*}(TE_2 - TE_1) = 2\pi\ln\left[\frac{S(TE_1)}{S(TE_2)}\right]. \quad (5)$$

We claim:

1. A method for producing an image indicative of temperature changes in a subject positioned in an NMR system, the steps comprising a) performing a scan by executing an NMR pulse sequence having an echo time ($TE_1$) to acquire reference NMR data from tissues in the subject;

b) reconstructing a reference phase image from the acquired NMR data c) performing a scan by executing an NMR pulse sequence having an echo time ($TE_2$) to acquire measurement NMR data from said tissues;

d) reconstructing a measurement phase image from the acquired measurement NMR data; and e) producing a temperature map based on the difference between the measurement phase image and the reference phase image.

2. The method as recited in claim 1 in which the echo times $TE_1$ and $TE_2$ are chosen to correspond with moments when the NMR signals produced by fat spins and water spins are in-phase and out-of-phase respectively.

3. The method as recited in claim 1 in which the echo times $TE_1$ and $TE_2$ are chosen to correspond with moments when the NMR signals produced by fat spins and water spins are out-of-phase and in-phase respectively.

4. The method as recited in claim 1 in which the steps c), d) and e) are repeated a plurality of times to produce a corresponding plurality of additional temperature maps.

5. The method as recited in claim 1 in which the NMR pulse sequences are gradient echo pulse sequences.

6. The method as recited in claim 1 in which the temperature map is produced by calculating the complex difference between corresponding values in the measurement phase image and the reference phase image.

7. A method for producing an image indicative of temperature changes in a subject positioned in an NMR system, the steps comprising:

a) performing a scan by executing an NMR pulse sequence that produces a first NMR echo signal at a first echo time ($TE_1$) and a second NMR echo signal at a second echo time ($TE_2$) from tissues in the subject;

b) separately acquiring NMR data produced by the first and second NMR echo signals during the scan to form respective reference and measurement data sets;

c) reconstructing a reference phase image from the reference data set;

d) reconstructing a measurement phase image from the measurement data set;

e) producing a temperature map based on the difference between the measurement phase image and the reference phase image.

8. The method as recited in claim 7 in which the echo times $TE_1$ and $TE_2$ are chosen to correspond with moments when the NMR signals produced by fat spins and water spins are in-phase and out-of-phase respectively.

9. The method as recited in claim 7 in which the echo times $TE_1$ and $TE_2$ are chosen to correspond with moments when the NMR signals produced by fat spins and water spins are out-of-phase and in-phase respectively.

10. The method as recited in claim 7 in which the NMR pulse sequence is a gradient echo pulse sequence.

11. The method as recited in claim 7 in which the temperature map is produced by calculating the complex difference between corresponding values in the measurement phase image and the reference phase image.

12. The method in claim 7 in which variable bandwidth readouts are used.

* * * * *